United States Patent
Lee et al.

(10) Patent No.: US 7,635,651 B2
(45) Date of Patent: Dec. 22, 2009

(54) METHOD OF SMOOTHENING DIELECTRIC LAYER

(75) Inventors: Wen-Long Lee, Taipei (TW); Jun Wu, Taoyuan County (TW); Shih-Chi Lin, Shih-Chu (TW); Chyi-Tsong Ni, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 439 days.

(21) Appl. No.: 11/208,612

(22) Filed: Aug. 23, 2005

(65) Prior Publication Data
US 2006/0189149 A1    Aug. 24, 2006

(51) Int. Cl.
*H01L 21/31* (2006.01)
*H01L 21/469* (2006.01)

(52) U.S. Cl. .................. 438/758; 438/723; 438/724; 438/787; 438/791; 438/694; 257/E21.24

(58) Field of Classification Search .......... 438/758, 438/695; 257/E21.24
See application file for complete search history.

(56) References Cited

U.S. PATENT DOCUMENTS

| | | | | |
|---|---|---|---|---|
| 4,572,841 A | * | 2/1986 | Kaganowicz et al. | 427/571 |
| 4,681,653 A | * | 7/1987 | Purdes et al. | 438/695 |
| 5,252,520 A | * | 10/1993 | Kocmanek et al. | 438/702 |
| 5,591,681 A | * | 1/1997 | Wristers et al. | 438/762 |
| 5,605,859 A | | 2/1997 | Lee | |
| 5,741,740 A | | 4/1998 | Jang et al. | |
| 5,786,278 A | | 7/1998 | Fry | |
| 5,792,705 A | * | 8/1998 | Wang et al. | 438/624 |
| 6,808,748 B2 | * | 10/2004 | Kapoor et al. | 427/255.31 |
| 2002/0004272 A1 | * | 1/2002 | Li et al. | 438/253 |
| 2004/0067631 A1 | * | 4/2004 | Bu et al. | 438/592 |
| 2005/0032382 A1 | * | 2/2005 | Rossman | 438/695 |

* cited by examiner

*Primary Examiner*—Charles D Garber
*Assistant Examiner*—Angel Roman
(74) *Attorney, Agent, or Firm*—Birch, Stewart, Kolasch & Birch, LLP

(57) ABSTRACT

A method of smoothening a dielectric layer. First, a substrate is provided. Next, a dielectric layer is formed on the semiconductor substrate. Finally, the dielectric layer is smoothened by a plasma treatment employing a silane based gas and a nitrogen based gas.

20 Claims, 3 Drawing Sheets

METHOD OF SMOOTHENING DIELECTRIC LAYER

BACKGROUND OF THE INVENTION

1. Field of the Invention

The present invention relates to a semiconductor manufacturing process and in particular to a method of smoothening a dielectric layer.

2. Description of the Related Art

Semiconductor technology employs dielectric layers for electrical isolation and separation of conductive layers used to interconnect circuits within the microelectronics fabrication. When multiple levels of conductor layers are required to interconnect the high density of devices currently being fabricated within a semiconductor device, their separation is accomplished by inter-level metal dielectric (IMD) layers. Silicon oxide containing dielectric materials may be formed into inter-level metal dielectric (IMD) layers useful for employment in Semiconductor technology by chemical vapor deposition (CVD) methods. Furthermore, a dielectric layer with high k, such as a metal oxide, a nitride, or a stacked nitride and oxide, is widely used in a gate dielectric layer to prevent channel tunneling.

Many ways of forming a dielectric layer with good properties for certain purposes is widely seeking.

For example, Lee, in U.S. Pat. No. 5,605,859, discloses a method for forming a dielectric layer over a polysilicon resistor layer while employing plasma enhanced chemical vapor deposition (PECVD) from silane to form a silicon oxide dielectric layer. The polysilicon layer has already been formed upon a glasseous dielectric layer, so that the silicon oxide layer is deposited partly over the glasseous layer.

Further, Jang et al., in U.S. Pat. No. 5,741,740, disclose a method for forming a dielectric layer for shallow trench isolation (STI) wherein a conformal silicon oxide layer is first formed in the trench employing silane in a PECVD process, and then a gap filling silicon oxide is formed over the trench and conformal first silicon oxide layer employing SACVD in $O_3$-TEOS.

Still further, Fry, in U.S. Pat. No. 5,786,278, discloses a method for changing the tensile stress in a dielectric layer formed employing O.sub.3-TEOS in a SACVD process to a compressive stress. The method employs exposure of the silicon oxide dielectric layer to pressures above atmospheric pressure at temperatures below the stress conversion temperature for the dielectric layer at atmospheric pressure to bring about the conversion of stress.

Accordingly, chemical vapor deposition (CVD) is widely used to fabricate a dielectric layer. However, as the number of devices that may be included on a single semiconductor chip increases, the size of the device is reduced and the requirement of the quality of the dielectric layer is getting higher. We are seeking for a smooth and planar dielectric layer without particles.

SUMMARY OF THE INVENTION

Accordingly, an object of the invention is to provide a method of smoothening a dielectric layer, such that the quality of the dielectric is kept well after smoothening.

One feature of the present invention is the use of a silane based gas and a nitrogen based gas containing plasma to smoothen the dielectric layer. The surface of the dielectric layer formed by deposition is usually rough. It is supposed that the rough surface of the dielectric is caused by an agglomerate of the precursor gases. After treating the plasma containing a silane based gas and a nitrogen based gas, a smooth surface can be obtained on the dielectric layer.

To achieve the above objects, one aspect of the present invention provides a method of smoothening a dielectric layer. First, a substrate is provided. Next, a dielectric layer is formed on the semiconductor substrate. Finally, the dielectric layer is smoothen by a plasma treatment employing a silane based gas and a nitrogen based gas.

The dielectric layer can be formed by deposition, such as chemical vapor deposition (CVD).

According to the present invention, the dielectric layer can comprise oxide, nitride, undoped silicate glass (USG), fluorinated silicon glass (FSG), or a combination thereof.

According to the present invention, the silane based gas is silicane ($SiH_4$), and the nitrogen based gas is ammonia ($NH_3$) when the dielectric layer is a nitride. The volume ratio of silicane ($SiH_4$) and ammonia ($NH_3$) is small than 2.3.

According to the present invention, the silane based gas is silicane ($SiH_4$), and the nitrogen based gas is nitrous oxide ($N_2O$) when the dielectric layer is an oxide. The volume ratio of silicane ($SiH_4$) and ammonia ($NH_3$) is about 2.5~3.5.

Another aspect of the present invention provides a method of smoothening a dielectric layer. First, a substrate is provided in a chamber. Next, precursors are introduced into the chamber at the first time so as to deposit a dielectric layer on the substrate. Finally, the precursors is introduced into the chamber at the second time so as to smoothen the dielectric layer.

According to the present invention, the precursors comprise a silane based gas including silicane ($SiH_4$) and a nitrogen based gas including ammonia (NH3) when the dielectric layer comprises a nitride. The volume ratio of silicane (SiH4) and ammonia (NH3) is preferably small than 2.3.

According to the present invention, the precursors comprise a silane based gas including silicane ($SiH_4$) and a nitrogen based gas including nitrous oxide ($N_2O$) when the dielectric layer comprises an oxide. The volume ratio of silicane (SiH4) and nitrous oxide ($N_2O$) is preferably about 0.02~0.067.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A preferred embodiment of the present invention is now described with reference to the figures.

First, a substrate 100 is provided, as shown in FIG. 1. The substrate 100 is understood to possibly contain MOS transistors, resistors, logic devices, and the like, though they are omitted from the drawings for the sake of clarity. In the following, the term "substrate" is meant to include devices formed within a semiconductor wafer and the layers overlying the wafer. The term "substrate surface" is meant to include the uppermost exposed layers on a semiconductor wafer, such as a Si wafer surface, an insulating layer and metal wires.

Next, a dielectric layer 102 is preferably formed on the semiconductor substrate 100 by deposition, such as chemical vapor deposition (CVD), by introducing precursors into the chamber at the first time. The dielectric layer 102 takes a role to separate multiple levels of conductive layers for interconnecting or to be a gate dielectric layer to prevent channel tunneling. The dielectric layer 102 can comprise oxide, nitride, updoped silicate glass (USG), fluorinated silicon glass (FSG), or a combination thereof. The precursors comprise a silane based gas and a nitrogen based gas. When the dielectric layer 102 comprises a nitride, the silane based gas includes silicane ($SiH_4$), and the nitrogen based gas includes ammonia (NH3). As well, when the dielectric layer 102 comprises an oxide, the silane based gas includes silicane ($SiH_4$), and the nitrogen based gas includes nitrous oxide ($N_2O$).

Figure 1A:
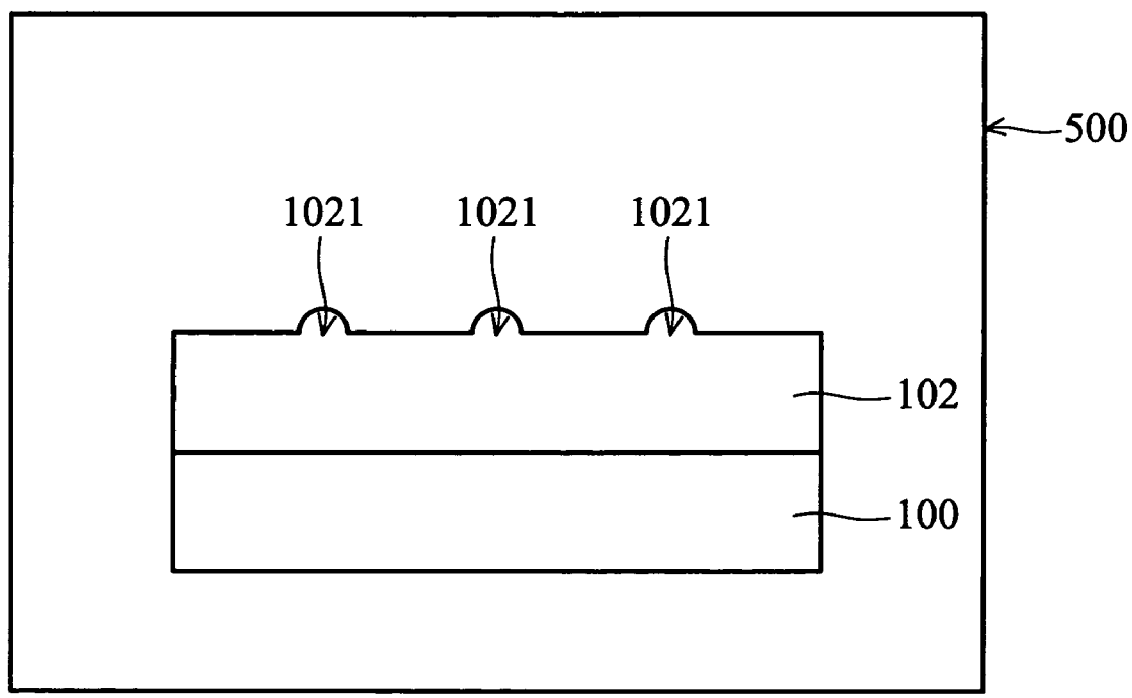
FIG. 1A through 1C are cross-sections showing the method of smoothening a dielectric layer according to one embodiment of the invention.

FIG. 1A shows an agglomerate of the precursor gases known to the inventors on the surface of the deposited dielectric layer 102, such that bulges 1021 are formed on the dielectric layer 102. During detecting defects by a defect scanning inspection, bulges 1021 with the size of about 0.2~1.0 µm will be erroneous counted into defects. This is not prior art for the purpose of determining the patentability of the present invention. This merely shows a problem found by the inventors.

Figure 1B:
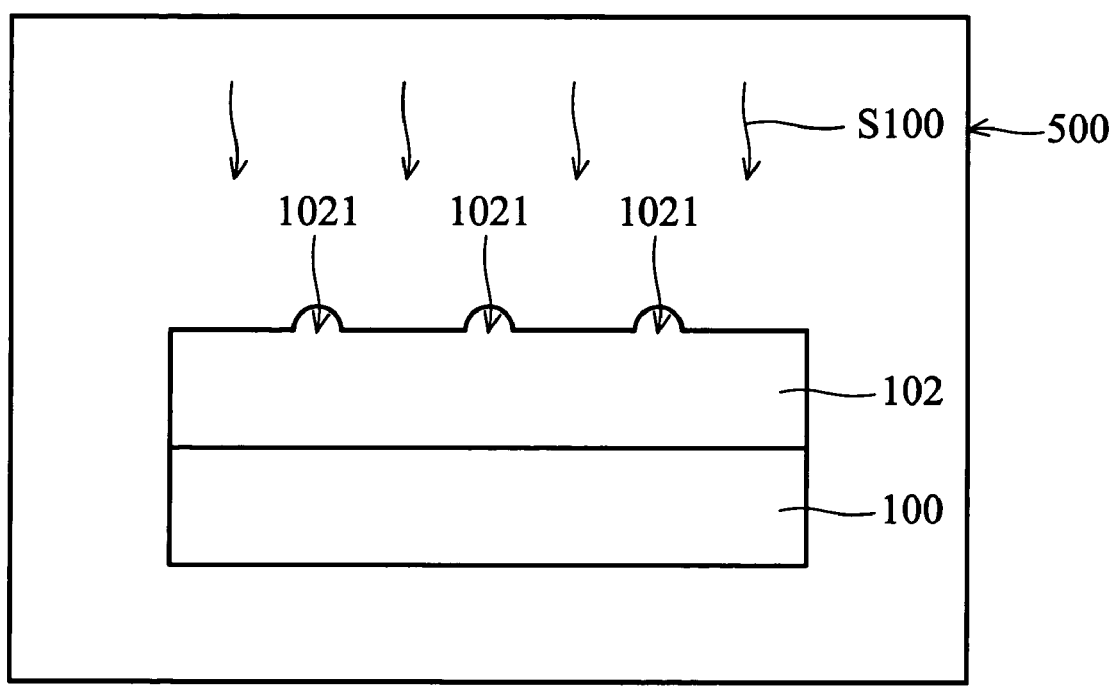
Figure 1C:
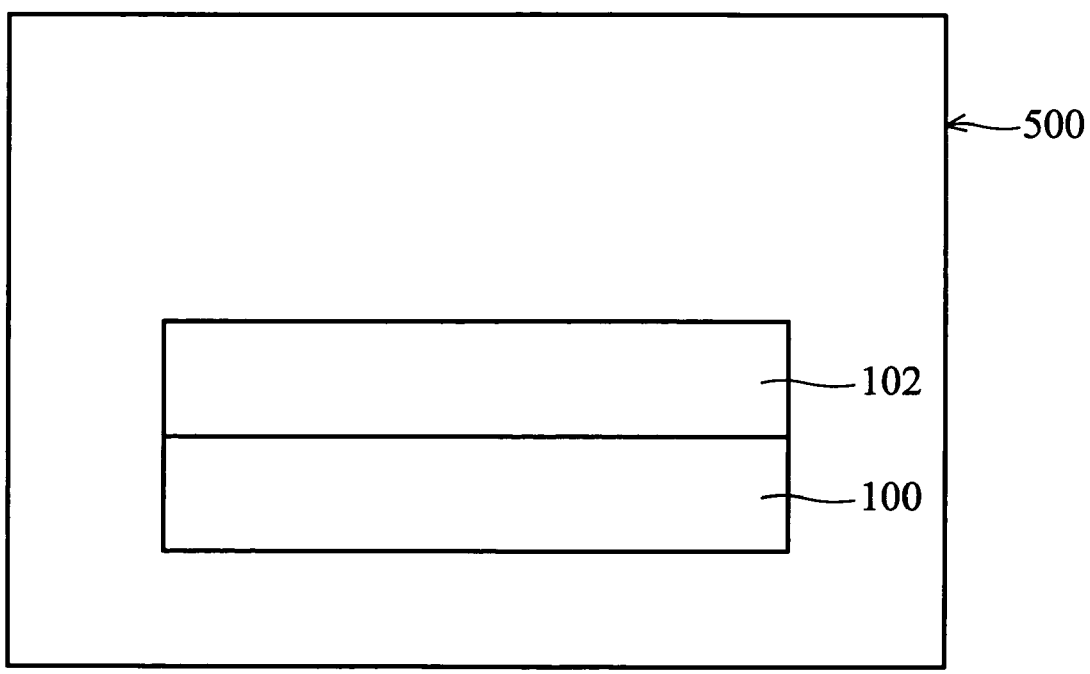

In FIG. 1B, a plasma treatment S100 is preformed in the dielectric layer 102 by introducing the precursors of the dielectric layer 102, comprising the silane based gas and the nitrogen based gas, into the chamber at the second tome. As description above, when the dielectric layer 102 comprises a nitride, the precursors comprise silicane ($SiH_4$) and ammonia (NH3); when the dielectric layer 102 comprises an oxide, the precursors comprises silicane ($SiH_4$) and nitrous oxide ($N_2O$). After the plasma treatment S100, the dielectric layer 102 is smoothen, as shown in FIG. 1C. Therefore, the agglomerate of the precursor gases is removed so as to obtain a smooth surface on the dielectric layer 102. According to our experiment, the amount of the agglomerate of the precursor gases is reduced from about several hundreds to several ten thousands after the plasma treatment S100. As well, the quality of the deposited dielectric layer 102 can keep well.

In one preferred embodiment of the present invention, silicane ($SiH_4$) and ammonia ($NH_3$) with a volume ratio smaller than 2.3 are employed as precursor gases in the plasma treatment for about 0.5~10 seconds when the material of the dielectric layer 102 is a nitride. The flow rate of the silicane ($SiH_4$) is about 60~100 ml/minute, and the flow rate of the ammonia ($NH_3$) is about 10~50 ml/minutes. The bias power is set to 100~300 W.

In another preferred embodiment of the present invention, silicane ($SiH_4$) and nitrous oxide ($N_2O$) with a volume ratio of about 0.02~0.067 are employed as precursor gases in the plasma treatment for about 0.5~10 seconds when the material of the dielectric layer 102 is an oxide. The flow rate of the silicane ($SiH_4$) is about 50~200 ml/minute, and the flow rate of the nitrous oxide ($N_2O$) is about 1000~2000 ml/minutes. The bias power is set to 100~500 W.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. A method of forming a dielectric layer, comprising:
   providing a substrate in a chamber;
   introducing a silane gas and a nitrogen gas in the chamber, thereby allowing the silane gas and the nitrogen gas to react to form a dielectric layer on the substrate with a bulge thereon, wherein the bulge is formed by a chemical reaction of an agglomerate of the silane gas and the nitrogen gas during forming the dielectric layer; and
   removing the bulge by providing a plasma treatment employing the silane based gas and the nitrogen based gas again with a first volume ratio to bombard a surface of the dielectric layer.

2. The method as claimed in claim 1, wherein the dielectric layer is formed by chemical vapor deposition (CVD).

3. The method as claimed in claim 1, wherein the silane based gas comprises silicane ($SiH_4$), and the nitrogen based gas comprises ammonia ($NH_3$), and wherein the dielectric layer comprises a nitride.

4. The method as claimed in claim 3, wherein the first volume ratio is smaller than 2.3.

5. The method as claimed in claim 1, wherein the silane based gas comprises silicane ($SiH_4$), and the nitrogen based gas comprises nitrous oxide ($N_2O$), and wherein the dielectric layer comprises an oxide.

6. The method as claimed in claim 5, wherein the volume ratio of silicane ($SiH_4$) and nitrous oxide ($N_2O$) is about 2.5~3.5.

7. The method as claimed in claim 1, wherein the treatment is performed for about 0.5~10 seconds at a bias power of 100~300 W.

8. A method of smoothening a dielectric layer, comprising:
   providing a substrate in a chamber;
   introducing an introducing gas in the chamber, thereby allowing the introducing gas to react to form a dielectric layer on the substrate with a bulge thereon, wherein the bulge is formed by a chemical reaction of an agglomerate of the introducing gas during forming the dielectric layer; and
   removing the bulge on the dielectric layer by a plasma treatment, wherein the introducing gas is employed again with a first volume ratio to bombard a surface of the dielectric layer during the plasma treatment.

9. The method as claimed in claim 8, wherein the dielectric layer is formed by chemical vapor deposition (CVD).

10. The method as claimed in claim 8, wherein the dielectric layer comprises oxide, nitride, updoped silicate glass (USG), fluorinated silicon glass (FSG), or a combination thereof.

11. The method as claimed in claim 8, wherein the introducing gas comprises a nitrogen-containing gas.

12. The method as claimed in claim 11, wherein the nitrogen-containing gas comprises $N_2$, $NH_3$, $N_2O$, or a combination thereof.

13. The method as claimed in claim 8, wherein the introducing gas comprises a silane-containing gas.

14. The method as claimed in claim 8, wherein the plasma treatment is performed for about 0.5~10 seconds at a bias power of 100~500 W.

15. A method of smoothening a dielectric layer, comprising:
   providing a substrate in a chamber;
   introducing precursors into the chamber at the first time, thereby allowing the precursors to react to deposit a dielectric layer on the substrate with a bulge thereon, wherein the bulge is formed by a chemical reaction of an agglomerate of the precursors during forming the dielectric layer; and
   removing the bulge on the dielectric layer by introducing the precursors into the chamber at the second time with a first volume ratio to bombard a surface of the dielectric layer.

16. The method as claimed in claim 15, wherein the dielectric layer is formed by chemical vapor deposition (CVD).

17. The method as claimed in claim 15, wherein the precursors comprise a silane based gas including silicane ($SiH_4$), and a nitrogen based gas including ammonia ($NH_3$), and wherein the dielectric layer comprises a nitride.

18. The method as claimed in claim 17, wherein the first volume ratio is smaller than 2.3.

19. The method as claimed in claim 15, wherein the precursors comprise silicane ($SiH_4$), and nitrous oxide ($N_2O$), and wherein the dielectric layer comprises an oxide.

20. The method as claimed in claim 19, wherein the volume ratio of silicane ($SiH_4$) and nitrous oxide ($N_2O$) is about 0.02~0.067.

* * * * *